(12) United States Patent
Hatano et al.

(10) Patent No.: US 7,402,901 B2
(45) Date of Patent: Jul. 22, 2008

(54) SEMICONDUCTOR DEVICE AND METHOD OF MANUFACTURING SEMICONDUCTOR DEVICE

(75) Inventors: Masaki Hatano, Kanagawa (JP); Yuji Takaoka, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 11/366,123

(22) Filed: Mar. 2, 2006

(65) Prior Publication Data

US 2006/0226527 A1    Oct. 12, 2006

(30) Foreign Application Priority Data

Mar. 16, 1920    (JP) ............................ P2005-075165

(51) Int. Cl.
*H01L 23/06* (2006.01)
(52) U.S. Cl. ........................ 257/684; 257/777; 257/686; 257/778; 257/E21.499; 257/E23.061
(58) Field of Classification Search ...................... None
See application file for complete search history.

(56) References Cited

U.S. PATENT DOCUMENTS 7,198,980 B2 * 4/2007 Jiang et al. .................. 438/107

FOREIGN PATENT DOCUMENTS

| JP | 08-250653 | * | 9/1996 |
| JP | 2004-079745 | * | 3/2004 |

* cited by examiner

*Primary Examiner*—A. Sefer
*Assistant Examiner*—Scott R Wilson
(74) *Attorney, Agent, or Firm*—Sonnenschein Nath & Rosenthal LLP

(57) ABSTRACT

The present invention provides a semiconductor device that is inexpensive and can suppress signal transmission delay, and a manufacturing method thereof. The semiconductor device includes: a plurality of semiconductor chips; a semiconductor substrate that has, on the same surface thereof, a chip-to-chip interconnection for electrically connecting the plurality of semiconductor chips to each other, and a plurality of chip-connection pads connected to the chip-to-chip interconnection; and a wiring board that has a plurality of lands of which pitch is larger than a pitch of the chip-connection pads, wherein a major surface of each of the plurality of semiconductor chips is connected to the chip-connection pads via a first connector so that the plurality of semiconductor chips are mounted on the semiconductor substrate, and an external-connection pad is formed on the major surface other than a region facing the semiconductor substrate, and is connected to the land on the wiring board via a second connector.

4 Claims, 17 Drawing Sheets

SEMICONDUCTOR DEVICE AND METHOD OF MANUFACTURING SEMICONDUCTOR DEVICE

CROSS REFERENCES TO RELATED APPLICATIONS

The present invention contains subject matter related to Japanese Patent Application JP 2005-075165 filed in the Japanese Patent Office on Mar. 16, 2005, the entire contents of which being incorporated herein by reference.

BACKGROUND OF THE INVENTION

The present invention relates to semiconductor devices referred to as a so-called system in package, in which a plurality of semiconductor chips are mounted in one package form, and manufacturing methods thereof. The invention relates more particularly to a semiconductor device having a structure in which a semiconductor substrate is used to electrically coupling a plurality of semiconductor chips, and a manufacturing method thereof.

Recent trends of electronic apparatuses toward higher functions are requiring that semiconductor chips used in the apparatuses also have higher functions. However, an attempt to achieve higher functions with a system on chip (SoC) approach, in which a large-scale functional system is formed on one chip, requires large-scale development of the chip, causing problems of a long development period and high costs. Therefore, there have been proposed system in package (SiP) approaches, in which a plurality of semiconductor chips are mounted on an interposer substrate and the resultant component is used as one package part.

For example, Japanese Patent Laid-open No. 2004-79745 (hereinafter referred to as Patent Document 1) discloses an SiP approach in which plural chips are flip-chip mounted side-by-side on a silicon interposer substrate.

This SiP structure will be described with reference to FIG. 16. A silicon interposer substrate 53 has a surface interconnect layer 50 and through via portions 56. The surface interconnect layer 50 has fine interconnections (interconnections with e.g. submicron lines and spaces) for interconnection among e.g. plural chips, and pads with a small pitch (e.g. a pitch of 60 μm or smaller) for connection to the chips. The through via portion 56 is a conductive portion that is formed by e.g. plating in a manner of filling a through via that penetrates the silicon interposer substrate 53 in the thickness direction thereof, with an insulating film being interposed between the sidewall of the through via and the conductive portion. The through via portions 56 function to guide interconnections from the pads in the surface interconnect layer 50 to pads 49 that are formed (rearranged) on the lower surface (the opposite surface to the chip-mounted surface) of the silicon interposer substrate 53, and have a comparatively large pitch (e.g. a pitch of 100 μm or larger) allowing connection to an organic interposer substrate 57.

A plurality of semiconductor chips 2a and 2b are flip-chip connected via solder bumps 51 onto the surface interconnect layer 50 of the silicon interposer substrate 53, so as to be mounted on the silicon interposer substrate 53. The gap between the semiconductor chips 2a and 2b and the silicon interposer substrate 53 is filled with an underfill resin material 54.

The silicon interposer substrate 53 is electrically connected and mounted onto the organic interposer substrate 57 via the pads 49 provided on the lower surface, solder bumps 58, and lands 59 on the organic interposer substrate 57. The gap between the silicon interposer substrate 53 and the organic interposer substrate 57 is filled with an underfill resin material 55.

In addition, as another technique, Japanese Patent Laid-open No. Hei 8-250653 (hereinafter referred to as Patent Document 2) discloses a SiP approach employing a silicon interposer substrate that does not have through via portions. FIG. 17 illustrates the structure of this SiP. A plurality of semiconductor chips 62a and 62b are connected via solder bumps 64 to a silicon interposer substrate 61. The silicon interposer substrate 61 is connected via solder bumps 65 to an organic interposer substrate 63, through the same surface thereof as the surface on which the semiconductor chips 62a and 62b are mounted.

SUMARRY OF THE INVENTION

The SiP approach of the Patent Document 1 however requires the formation of the through vias penetrating the silicon interposer substrate 53 and the formation of the conductive portions 56 buried in the through vias. Silicon etching for forming the through vias and the precipitation of the conductive portions 56 by plating in the through vias take high costs and long time periods, which problematically results in an increase of manufacturing costs of the entire semiconductor device.

In addition, the silicon interposer substrate 53 has, besides the chip-to-chip interconnect layer 50 with a fine design rule that meets the design rule of the semiconductor chips 2a and 2b, the pads 49 on the under surface thereof having a comparatively large pitch in conformity to the design rule of the organic interposer substrate 57. Due to this large pitch of the pads 49, the size of the silicon interposer substrate 53 in the plane direction thereof tends to be large, which also leads to high costs.

In the SiP approach of the Patent Document 2, the silicon interposer substrate 61 has pads for connection to the organic interpose substrate 63 on its surface same as the surface on which the semiconductor chips 62a and 62b are mounted. The semiconductor chips 62a and 62b are connected to the organic interposer substrate 63 via interconnections formed on the silicon interposer substrate 61. Therefore, the length of interconnections between the semiconductor chips 62a and 62b and the organic interposer substrate 63 tends to be large, which readily causes delay of signal transmission between the semiconductor chips 62a and 62b and the organic interposer substrate 63.

Furthermore, the silicon interposer substrate 61 has, besides the interconnections for coupling the semiconductor chips 62a and 62b with each other, interconnections for connecting the semiconductor chips 62a and 62b to the external (in this example, the organic interposer substrate 63). The existence of these lead-to-external interconnections reduces the flexibility of route layout of the chip-to-chip interconnections, and thus the length of the chip-to-chip interconnections tends to be large, which readily causes delay of signal transmission between the semiconductor chips 62a and 62b.

The present invention is made in consideration of the above-described problems, and an object thereof is to provide a semiconductor device that is inexpensive and can suppress signal transmission delay, and a manufacturing method thereof.

The present invention employs the following embodiments in order to solve the above-described problems.

Specifically, a semiconductor device according to one embodiment of the invention includes a plurality of semiconductor chips, a semiconductor substrate that has, on the same surface thereof, a chip-to-chip interconnection for electrically connecting the plurality of semiconductor chips to each other, and a plurality of chip-connection pads connected to the chip-to-chip interconnection, and a wiring board that has a plurality of lands of which pitch is larger than the pitch of the chip-connection pads. The major surface of each of the plurality of semiconductor chips is connected to the chip-connection pads via a first connector so that the plurality of semiconductor chips are mounted on the semiconductor substrate. An external-connection pad is formed on the major surface other than the region facing the semiconductor substrate, and is connected to the land on the wiring board via a second connector.

In addition, a semiconductor device according to another embodiment of the invention includes a plurality of semiconductor chips, and a semiconductor substrate that has, on the same surface thereof, a chip-to-chip interconnection for electrically connecting the plurality of semiconductor chips to each other, and a plurality of chip-connection pads connected to the chip-to-chip interconnection. The major surface of each of the plurality of semiconductor chips is connected to the chip-connection pads via a connector so that the plurality of semiconductor chips are mounted on the semiconductor substrate. A plurality of external-connection pads are formed on the major surface other than the region facing the semiconductor substrate, the external-connection pads having a pitch larger than a pitch of the chip-connection pads.

Moreover, a method of manufacturing a semiconductor device according to still another embodiment of the invention includes the steps of forming a chip-to-chip interconnection and a plurality of chip-connection pads connected to the chip-to-chip interconnection on the same surface of a semiconductor substrate, and forming a plurality of external-connection pads on a major surface of a plurality of semiconductor chips other than the region facing the semiconductor substrate. The external-connection pads have a pitch larger than the pitch of the chip-connection pads. The method also includes the steps of forming on a wiring board a plurality of lands having a pitch equal to the pitch of the external-connection pads, connecting the major surface of each of the plurality of semiconductor chips to the chip-connection pads on the semiconductor substrate via a first connector, to thereby mount the plurality of semiconductor chips on the semiconductor substrate, and connecting the external-connection pads on the semiconductor chips to the lands on the wiring board via a second connector.

The plurality of semiconductor chips are electrically connected to each other via the chip-to-chip interconnection formed on the semiconductor substrate, and are directly coupled to the wiring board without the intermediary of the semiconductor substrate.

The semiconductor substrate has only a function of connecting the plurality of semiconductor chips to each other. On the surface of the wiring board opposite to the land-formed surface bonded to the semiconductor chips, lands in conformity to the design rule of a wiring board referred to as a so-called motherboard are formed. The wiring board therefore functions as an interposer that interconnects the semiconductor chips and the motherboard.

Fine and small-pitch electrode pads formed on the major surfaces of the semiconductor chips are coupled to (rearranged as) the external-connection pads having a size and a pitch that meet the design rule of the external.

There is no need to form on the semiconductor substrate, pads having comparatively large size and pitch that meet the design rule of the wiring board for connection to the wiring board. That is, it is sufficient for the semiconductor substrate to have thereon, as pads, only the chip-connection pads having finer size and pitch for connection to the semiconductor chips. Therefore, the plane size of the semiconductor substrate can be decreased, which allows the reduction of costs of the semiconductor substrate.

The semiconductor chips are connected to the external (wiring board) via the external-connection pads provided directly on the semiconductor chips, without the intermediary of the semiconductor substrate. Therefore, compared with the above-described Patent Document 2, in which semiconductor chips are connected to a wiring board via a semiconductor substrate, the length of interconnections between the semiconductor chips and wiring board can be decreased, which can suppress delay of signal transmission between the semiconductor chips and wiring board.

Moreover, as to interconnections, the semiconductor substrate has thereon only the chip-to-chip interconnection but does not have interconnections for connecting the semiconductor chips to the wiring board. Therefore, the chip-to-chip interconnection can be formed collectively on a certain region on the semiconductor substrate without the route design thereof suffering interference from the interconnections for connecting the semiconductor chips to the wiring board. Accordingly, the length of the chip-to-chip interconnection can be decreased, which allows the suppression of delay of signal transmission between the semiconductor chips.

If the semiconductor substrate is placed in a hollow formed in the wiring board, an increase of the thickness of the entire semiconductor device can be suppressed. In addition, if the semiconductor substrate is fixed to the wiring board by supplying a resin material in the hollow, stress acting on the bonding parts by the first and second connectors can be reduced, which can enhance the bonding reliability of the bonding parts.

Furthermore, if the semiconductor substrate is placed in the hollow formed in the wiring board in advance before the bonding of the semiconductor chips to the semiconductor substrate, a method similar to an existing mounting method can be used in which semiconductor chips are picked up one by one to be mounted on a semiconductor substrate with use of an existing mounting device such as a vacuum suction tool. This method avoids a cost increase and the lowering of the mounting efficiency.

According to the embodiments of the present invention, the semiconductor substrate has only a function of electrically connecting a plurality of semiconductor chips with each other, but does not have a function of guiding electrode pads on the semiconductor chips to pads having an enlarged pitch for connection to the external. Therefore, there is no need to form through holes penetrating the semiconductor substrate and form conductive members buried in the through holes, and thus correspondingly processing costs and time can be reduced. As a result, the costs of the entire semiconductor device can be decreased. The semiconductor chips are connected to the external (wiring board) via the external-connection pads provided directly on the semiconductor chips, without the intermediary of the semiconductor substrate. Therefore, the length of interconnections between the semiconductor chips and wiring board can be decreased, which can suppress delay of signal transmission between the semiconductor chips and wiring board. Moreover, as to interconnections, the semiconductor substrate has thereon only the chip-to-chip interconnection but does not have interconnections for connecting the semiconductor chips to the wiring board. Therefore, the chip-to-chip interconnection can be formed collectively on a certain region on the semiconductor substrate without the route design thereof suffering interference from the interconnections for connecting the semiconductor chips to the wiring board. Accordingly, the length of the chip-to-chip interconnection can be decreased, which allows the suppression of delay of signal transmission between the semiconductor chips.

DETAILED DESCRIPTION OF THE PREFERRED EMBODIMENTS

Embodiments of the present invention will be described in detail below with reference to the accompanying drawings. It should be noted that the present invention is not limited to the following embodiments but various modifications can be made based on the technical idea of the present invention.

First Embodiment

Figure 1:
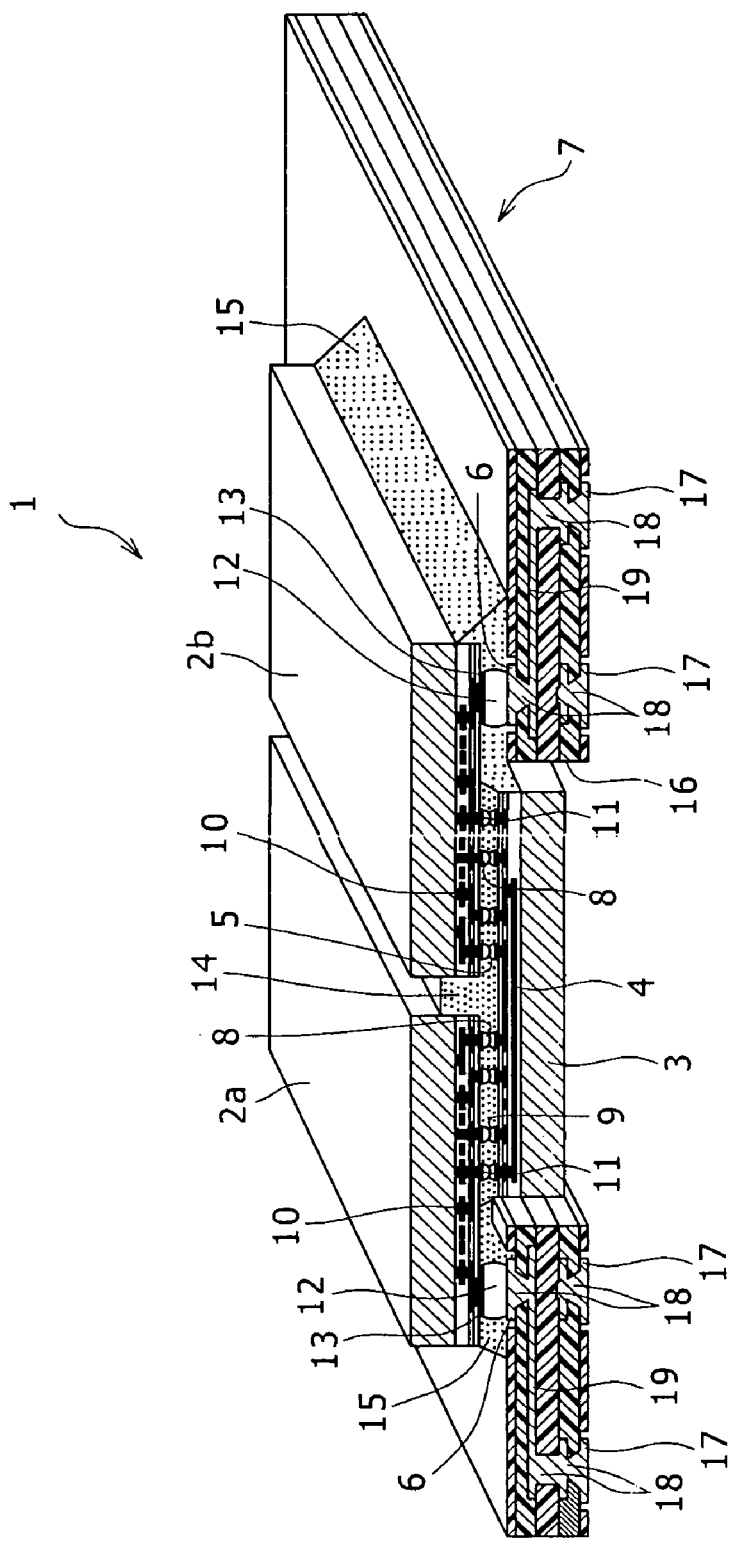
FIG. 1 is a partially sectional perspective view of a semiconductor device according to a first embodiment of the present invention.
Figure 2:
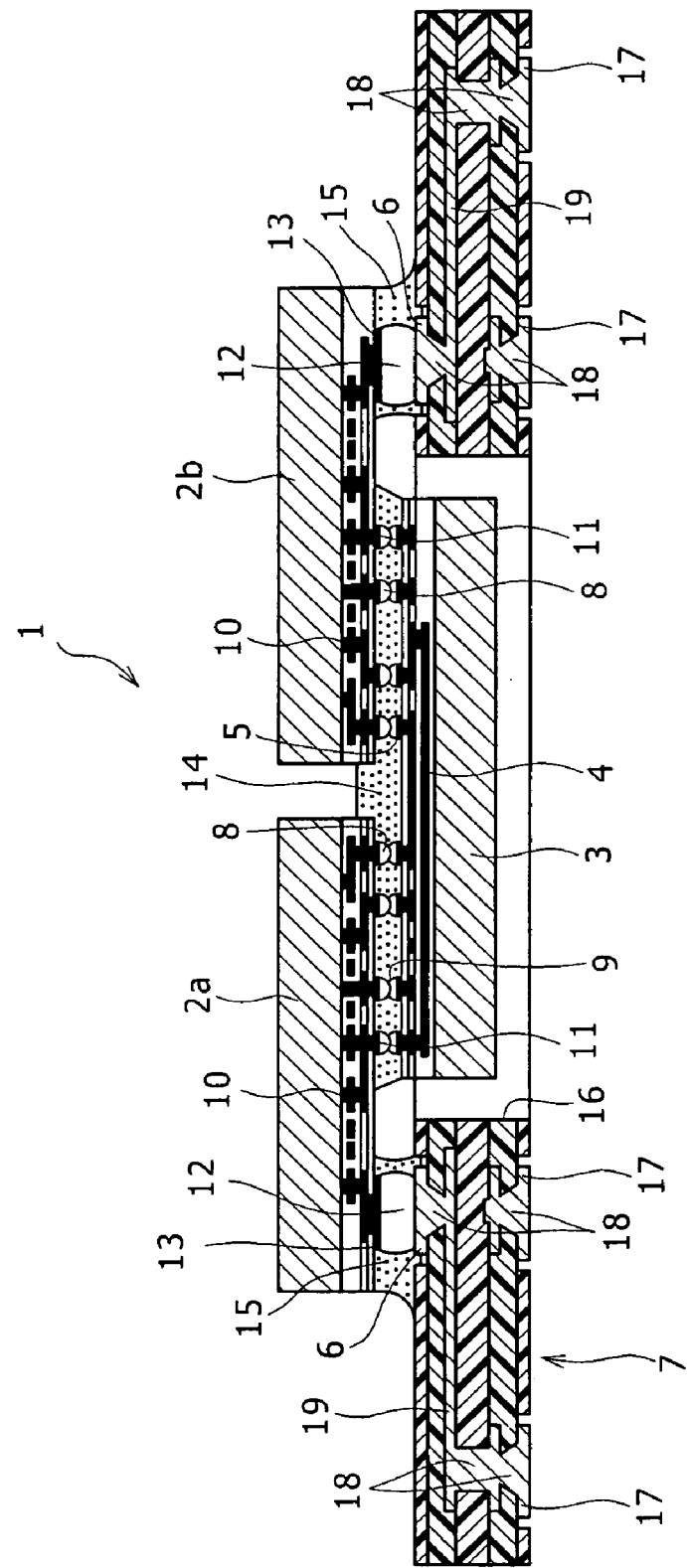
FIG. 2 is a sectional view of the semiconductor device according to the first embodiment.

FIG. 1 is a partially sectional perspective view illustrating a semiconductor device 1 according to a first embodiment of the present invention. FIG. 2 is a sectional view illustrating the semiconductor device 1.

The semiconductor device 1 includes a semiconductor substrate 3, a plurality of semiconductor chips 2a and 2b mounted on the semiconductor substrate 3, and a wiring board 7 connected to the semiconductor chips 2a and 2b.

The semiconductor substrate 3 has, on the same surface thereof, chip-to-chip interconnections 4 for electrically connecting the semiconductor chips 2a and 2b to each other, and a plurality of chip-connection pads 5 connected to the chip-to-chip interconnections 4.

The major surfaces (IC-formed surfaces) of the semiconductor chips 2a and 2b are connected via first connectors 8 and 9 to the chip-connection pads 5 on the semiconductor substrate 3. Thus, the semiconductor chips 2a and 2b are electrically connected to each other via the chip-to-chip interconnections 4 formed on the semiconductor substrate 3. A space around the bonding parts between the semiconductor chips 2a and 2b and the semiconductor substrate 3 is filled with an underfill resin material 14, which protects the bonding parts.

A plurality of external-connection pads 13 are formed on the major surfaces of the semiconductor chips 2a and 2b other than the region facing the semiconductor substrate 3. A plurality of lands 6 are formed on the wiring board 7. The pitches of the external-connection pads 13 and the lands 6 are larger than the pitch of the chip-connection pads 5 on the semiconductor substrate 3 (the pitch of the first connectors 8 and 9). The external-connection pads 13 are connected to the lands 6 via second connectors 12, and thus the semiconductor chips 2a and 2b are electrically connected to the wiring board 7. A space around the bonding parts between the semiconductor chips 2a and 2b and the wiring board 7 is filled with an underfill resin material 15, which protects the bonding parts.

One example of a manufacturing method of the semiconductor device 1 will be described below.

Figure 3:
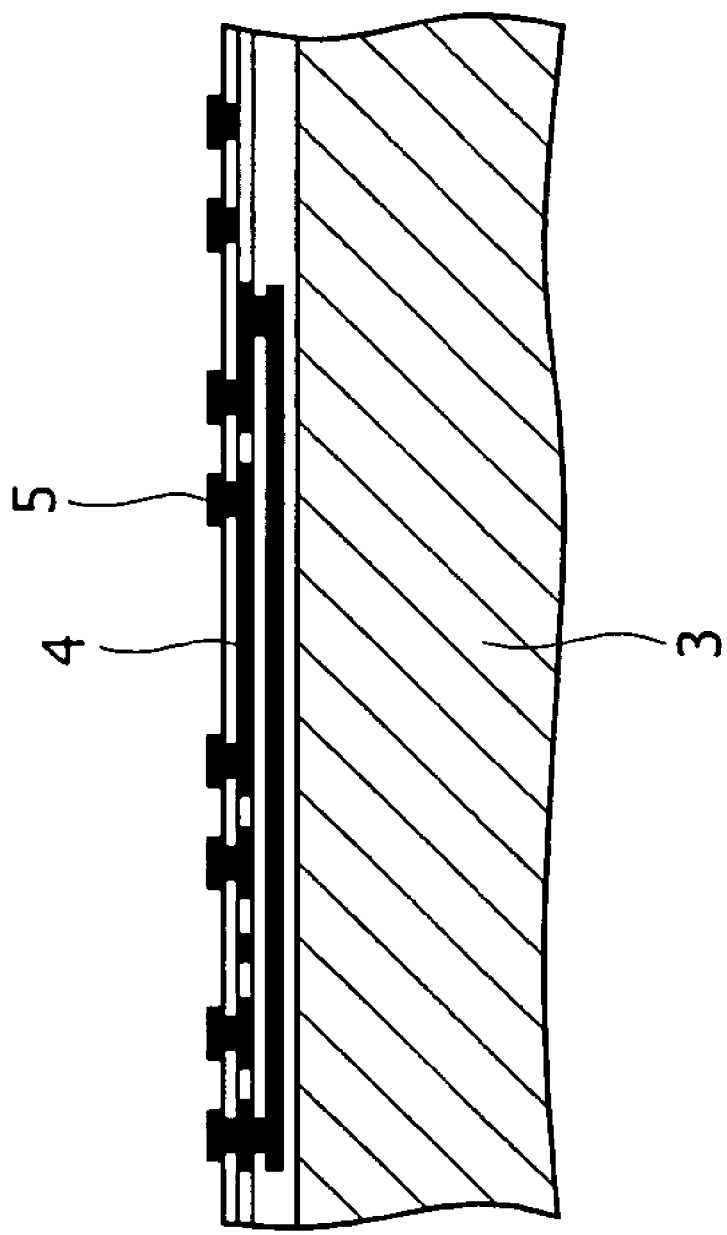
FIG. 3 is a first sectional view of a manufacturing step for the semiconductor device according to the first embodiment.

Referring to FIG. 3, the semiconductor substrate 3 is a silicon substrate for example. Formed on one surface thereof are the chip-to-chip interconnections 4 and a plurality of chip-connection pads 5 connected to the chip-to-chip interconnections 4. These chip-to-chip interconnections 4 and chip-connection pads 5 are formed by using techniques and equipment of a typical semiconductor wafer process. The chip-to-chip interconnections 4 have a multi-layer structure, and insulating layers are interposed among the interconnect layers for example. As the material of the chip-to-chip interconnections 4 and the chip-connection pads 5, e.g. copper or aluminum is available. When the semiconductor substrate 3 is formed of silicon, the insulating layers may be formed of a silicon oxide or a silicon nitride, or alternatively may be formed of a resin material such as polyimide. The chip-to-chip interconnections 4 may be formed of a single layer. The chip-to-chip interconnections 4 have a line-and-space pattern (the minimum line width) on the order of submicrons (0.1 to 1 μm). The chip-connection pads 5 have a pitch in the range of several microns to 60 μm. A typical semiconductor process allows the easy formation of interconnections and pads having such a design rule on the semiconductor substrate 3, which is a silicon substrate.

The semiconductor substrate 3 is not limited to a silicon substrate, but may be another semiconductor substrate composed of germanium, a compound semiconductor, or the like. In the present embodiment, the semiconductor chips 2a and 2b mounted on the semiconductor substrate 3 are silicon chips, and therefore a silicon substrate is used as the semiconductor substrate 3 in order to ensure the matching of the linear expansion coefficient between the semiconductor chips 2a and 2b and the semiconductor substrate 3. If the semiconductor substrate 3 and the semiconductor chips 2a and 2b mounted thereon have the same or close linear expansion coefficients, stress acting on the bonding parts between the both when the both are subjected to a temperature cycle can be suppressed, which can enhance the bonding reliability. It therefore is preferable for the semiconductor substrate 3 and the semiconductor chips 2a and 2b to be composed of the same material or be composed of materials having close linear expansion coefficients.

Figure 4:
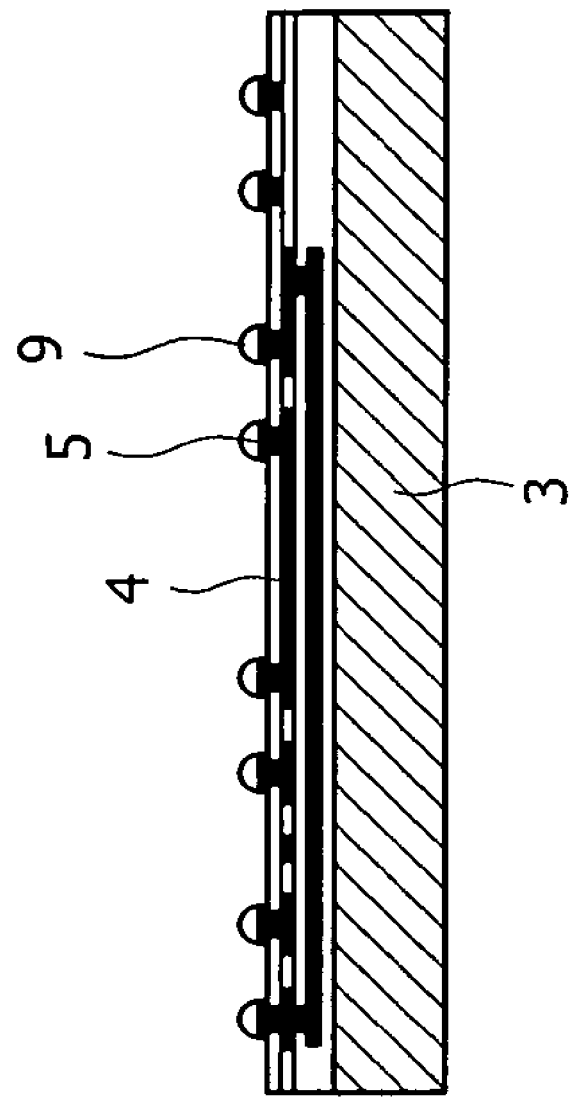
FIG. 4 is a second sectional view of a manufacturing step for the semiconductor device according to the first embodiment.

Referring next to FIG. 4, the first connectors 9 are formed on the chip-connection pads 5. The first connectors 9 are hemisphere solder bumps formed by e.g. plating or printing. The first connectors 9 may be formed of a metal or alloy other than solder, and the shape thereof may be a pillar shape.

After the first connectors 9 are formed, the back surface of the semiconductor substrate 3 (the opposite surface of the surface on which the chip-to-chip interconnections 4, the chip-connection pads 5 and the first connectors 9 have been formed) is polished with use of a back grinder, and thus the semiconductor substrate 3 is thinned. Subsequently, the semiconductor substrate 3 is cut along the thickness direction thereof by using a dicing saw, laser or another measure, so that the semiconductor substrate 3 is divided into individual chips.

Figure 5:
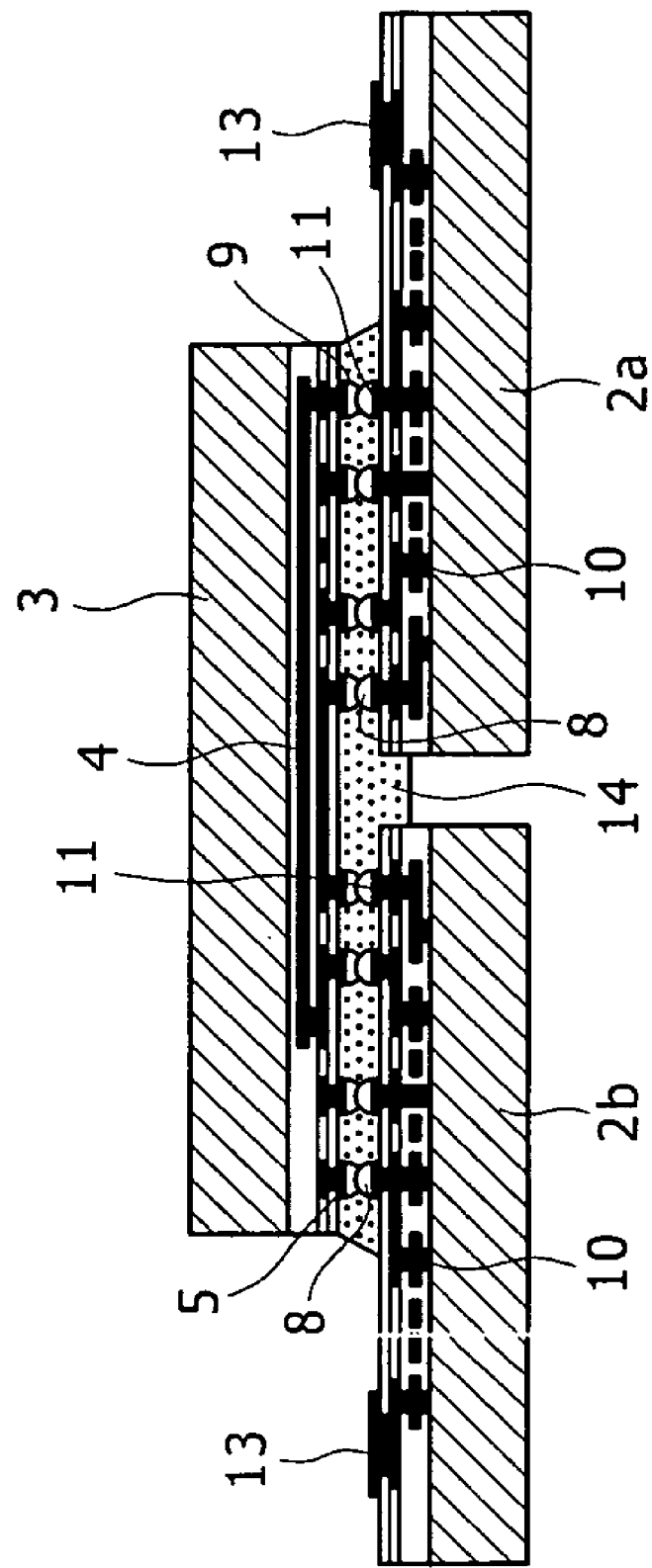
FIG. 5 is a third sectional view of a manufacturing step for the semiconductor device according to the first embodiment.

Referring next to FIG. 5, a plurality (two, in the present embodiment) of semiconductor chips 2a and 2b are bonded to the diced semiconductor substrate 3 via the first connectors 8 and 9.

The major surface (IC-formed surfaces) of each of the semiconductor chips 2a and 2b has thereon interconnections 10 and a plurality of pads 11 connected to the interconnections 10. Electrode pads (not shown) of the semiconductor chips 2a and 2b are coupled via the interconnections 10 to the pads 11 having a pitch larger than the pitch of the electrode pads. That is, the electrode pads are rearranged as the pads 11. The interconnections 10 and the pads 11 are formed in a step similar to the forming step of the chip-to-chip interconnections 4 and the chip-connection pads 5 on the semiconductor substrate 3. The pads 11 on the semiconductor chips 2a and 2b and the pads 5 on the semiconductor substrate 3 have the same pitch, and the numbers of the pads 11 and the pads 5 are the same.

The pads 11 on the semiconductor chips 2a and 2b have thereon the first connectors (e.g. solder bumps) 8 that are similar to the first connectors 9 formed on the chip-connection pads 5 of the semiconductor substrate 3. The connectors 8 and 9 are heat-melted while the connectors 8 and 9 are brought into contact with each other, which allows the connectors 8 and 9 to be bonded to each other. Thus, the interconnections 10 on the semiconductor chips 2a and 2b are electrically connected to the chip-to-chip interconnections 4 on the semiconductor substrate 3. Accordingly, two semiconductor chips 2a and 2b are electrically connected to each other via the chip-to-chip interconnections 4 on the semiconductor substrate 3.

The gap between the semiconductor substrate 3 and the semiconductor chips 2a and 2b is filled with the underfill resin material 14 so that the bonding parts by the first connectors 8 and 9 are covered, which protects the bonding parts against stress, dusts, water and so forth. In order to form the underfill resin material 14, e.g. a liquid or paste thermosetting resin is provided in the gap between the semiconductor substrate 3 and the semiconductor chips 2a and 2b with the chips 2a and 2b being located above the substrate 3, and then the provided resin is thermally cured.

Figure 6:
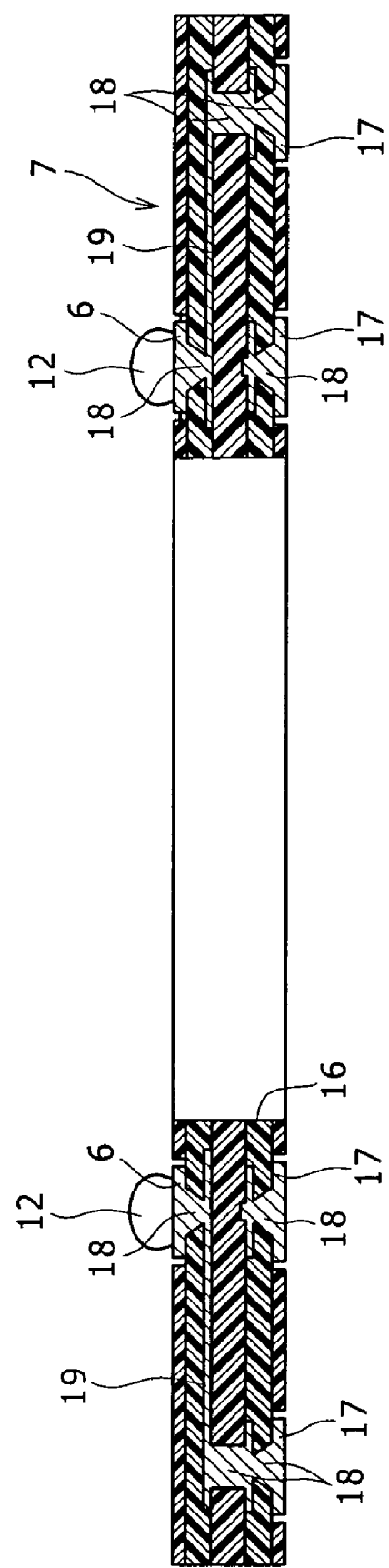
FIG. 6 is a fourth sectional view of a manufacturing step for the semiconductor device according to the first embodiment.

Each of the semiconductor chips 2a and 2b has, besides the pads 11 for connection to the semiconductor substrate 3, a plurality of external-connection pads 13 on the same surface as the surface on which the pads 11 are formed. The external-connection pads 13 are formed simultaneously with the formation of the pads 11, and are connected to the interconnections 10. The external-connection pads 13 are located on the semiconductor chips 2a and 2b other than the region facing the semiconductor substrate 3, specifically located on peripheral part of the semiconductor chips 2a and 2b. The external-connection pads 13 have a size and a pitch (e.g. a pitch of 100 μm or larger) larger than those of the pads 11. The external-connection pads 13 are bonded to the wiring board 7 shown in FIG. 6 via the second connectors 12.

The wiring board 7 is an organic wiring board such as a glass epoxy wiring board. A plurality of lands 6 are formed on one surface of the wiring board 7. The lands 6 have the same pitch as that of the external-connection pads 13 formed on the semiconductor chips 2a and 2b, and the number thereof is also the same as that of the external-connection pads 13. Formed on the opposite surface of the land-formed surface of the wiring board 7 are a plurality of lands 17 having a pitch larger than the pitch of the lands 6. The lands 6 and 17 are electrically connected to each other via conductive members 18 that fill vias formed in the wiring board 7 and interconnections 19. The lands 17 are provided as a result of the rearrangement of the lands 6, and thus offer a larger pitch than the pitch of the lands 6. The lands 6 and 17, the conductive members 18 and the interconnections 19 are composed of a metal material such as copper. The interconnections 19 have a multi-layer structure, and insulating layers are interposed among the interconnect layers.

The line-and-space pattern of the interconnections 19 and the pitches of the lands 6 and 17 are based on a design rule adopted in a typical organic wiring board. For example, the pitches of the lands 6 and 17 are at least 100 μm. As the wiring board 7, a ceramic wiring board composed of alumina or the like may be used instead of an organic wiring board.

Formed in the center part of the wiring board 7 is a hollow 16 having a plane size larger than that of the semiconductor substrate 3, as a through hole that penetrates the wiring board 7 in the thickness direction thereof. This hollow 16 can be formed by a machine tool, a laser, etching, or another measure.

Formed on the lands 6 of the wiring board 7 are e.g. solder bumps as the second connectors 12. For example, solder balls are mounted on the lands 6 by a transfer method employing a boll mounter or another method, followed by being turned into a hemispherical shape by solder reflow. Alternatively, the second connectors 12 may be pillar metal bumps formed by plating, printing or the like.

The semiconductor substrate 3 is placed in the hollow 16 of the wiring board 7, and the second connectors 12 are brought into contact with the external-connection pads 13 on the semiconductor chips 2a and 2b. In this state, the second connectors 12 are heat-melted, which couples the external-connection pads 13 on the semiconductor chips 2a and 2b to the lands 6 on the wiring board 7 via the second connectors 12. Thus, the semiconductor device 1 shown in FIGS. 1 and 2 is obtained.

Two semiconductor chips 2a and 2b are electrically connected to each other via the chip-to-chip interconnections 4 formed on the semiconductor substrate 3, and are directly coupled to the wiring board 7 without the intermediary of the semiconductor substrate 3.

On the surface of the wiring board 7 opposite to the surface bonded to the semiconductor chips 2a and 2b, the lands 17 in conformity to the design rule of a wiring board referred to as a so-called motherboard are formed. The wiring board 7 therefore functions as an interposer that interconnects the semiconductor chips 2a and 2b and the motherboard. The semiconductor substrate 3 has only a function of coupling the semiconductor chips 2a and 2b with each other.

As a result, the fine and small-pitch electrode pads formed on the major surfaces of the semiconductor chips 2a and 2b are coupled to (rearranged as) the land 17 having a size and a pitch that meet the design rule of the motherboard via the interconnections 10 and so on.

Formed on the lands 17 of the wiring board 7 are connecters such as solder balls or metal bumps, and the lands 17 are connected via the connectors to lands and interconnections formed on the motherboard. Besides the semiconductor device 1, a number of parts (other semiconductor devices, resistors, capacitors, connectors and so on) are mounted on the motherboard. These parts are electrically connected to the semiconductor device 1 via interconnections formed on the motherboard.

Figure 15:
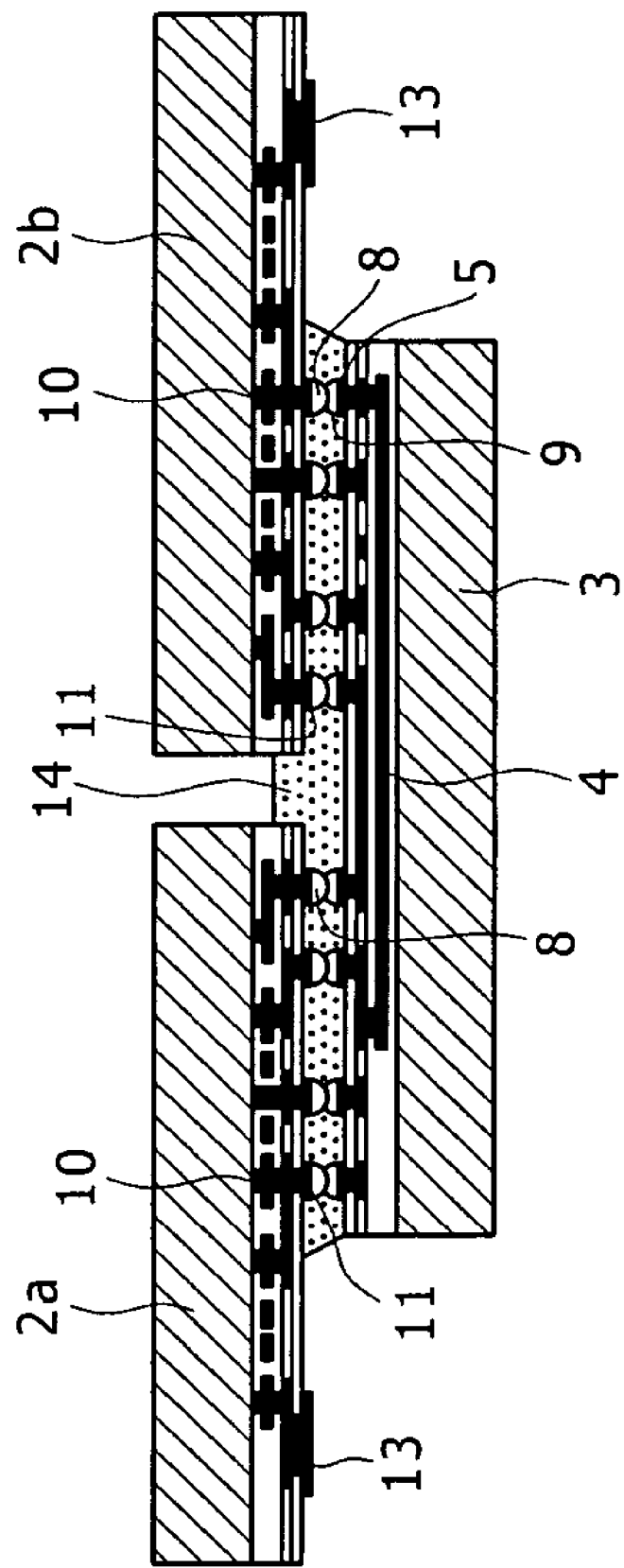
FIG. 15 is a sectional view illustrating a semiconductor device as a modification of embodiments of the present invention.

As another structure of the semiconductor device, a structure having no wiring board 7 is also available as shown in FIG. 15. Specifically, the external-connection pads 13 on the semiconductor chips 2a and 2b may be directly mounted on the motherboard via connectors such as solder balls or metal bumps. However, the external-connection pads 13 on the semiconductor chips 2a and 2b cannot have much large size and pitch due to the restriction of the sizes of the chips 2a and 2b. Therefore, there is a possibility that this direct connection cannot be used for a motherboard having a comparatively large design rule. Accordingly, a structure in which the external-connection pads 13 on the semiconductor chips 2a and 2b are rearranged via the wiring board 7 as the lands 17 having an enlarged pitch is preferable because this structure can avoid the micro-machining of the motherboard, which causes extra costs.

Figure 7:
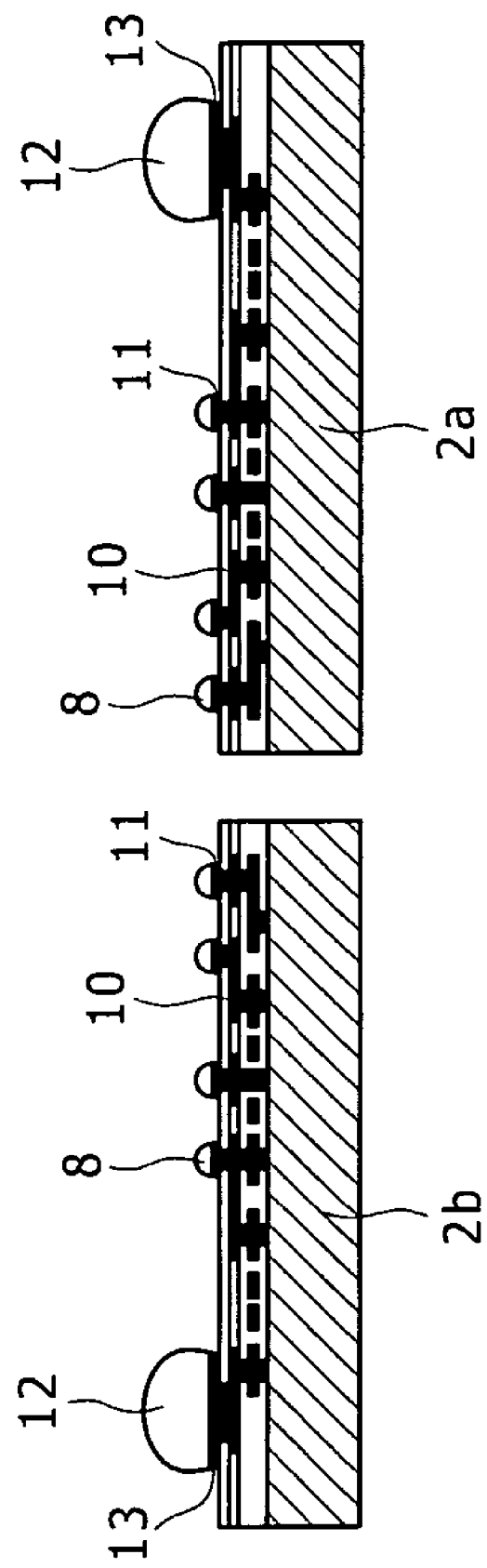
FIG. 7 is a fifth sectional view of a manufacturing step for the semiconductor device according to the first embodiment.
Figure 8:
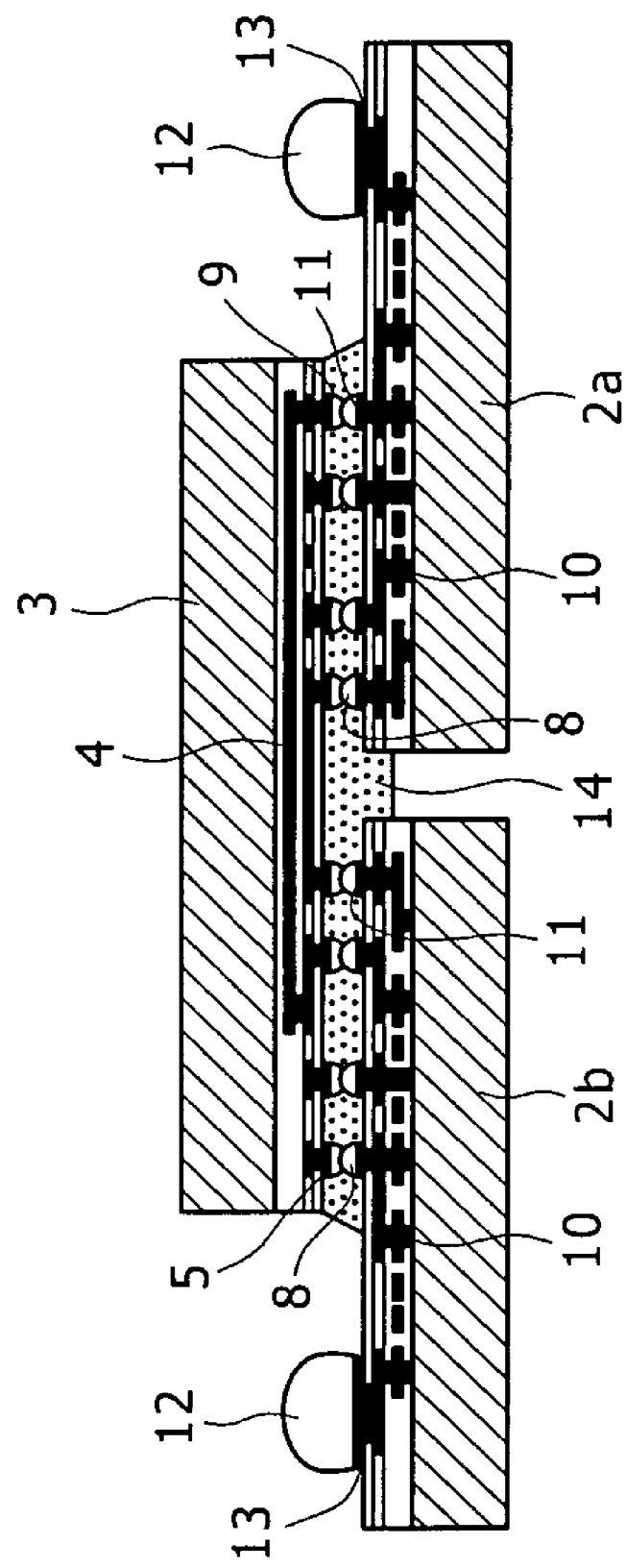
FIG. 8 is a sixth sectional view of a manufacturing step for the semiconductor device according to the first embodiment.

The manufacturing method is not limited to the above-described example. As shown in FIG. 7, after all the first connectors 8 and the second connectors 12 are formed on the pads 11 and 13, respectively, on the semiconductor chips 2a and 2b, the bonding between the semiconductor chips 2a and 2b and the semiconductor substrate 3 via the first connectors 8 (see FIG. 8), and the bonding between the semiconductor chips 2a and 2b and the wiring board 7 via the second connectors 12 may be carried out.

Figure 16:
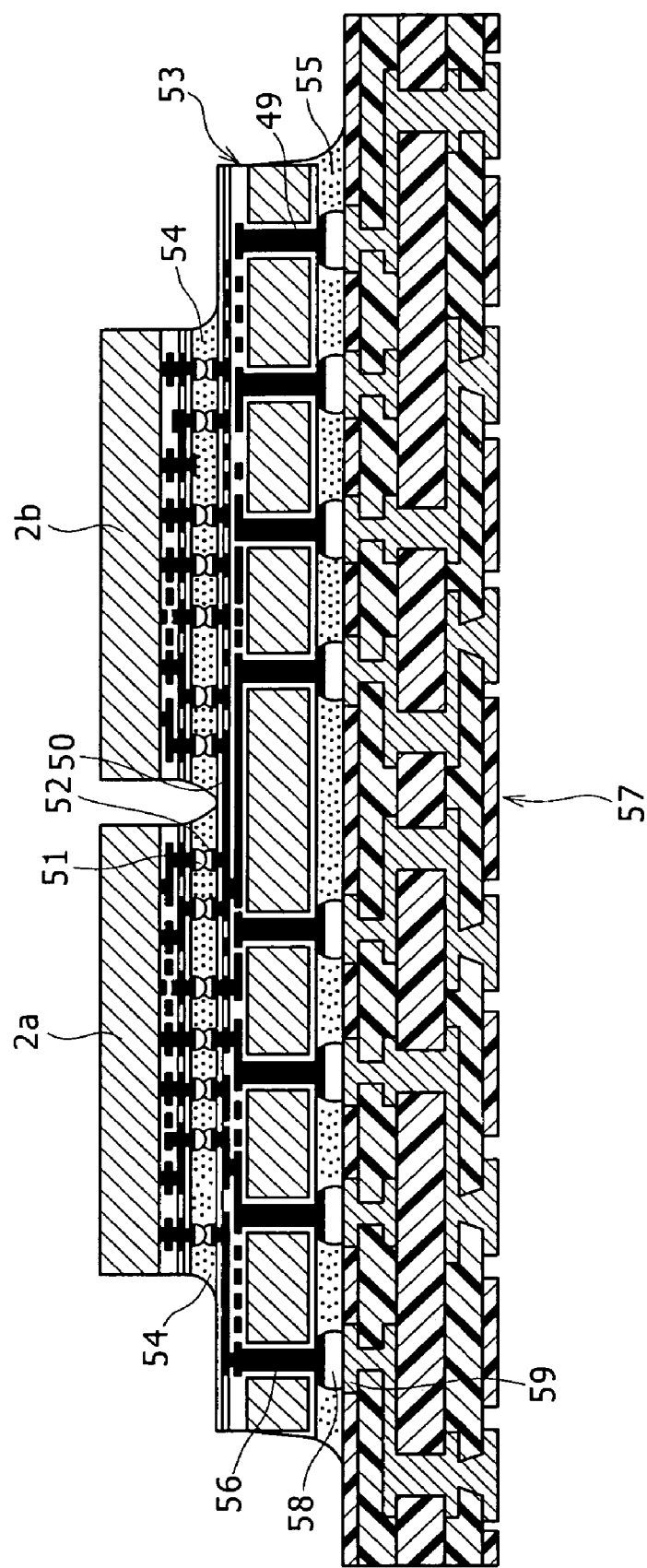
FIG. 16 is a sectional view illustrating a semiconductor device as a first conventional example.

As described above, in the semiconductor device 1 of the present embodiment, the semiconductor substrate 3 has only a function of electrically connecting a plurality of semiconductor chips 2a and 2b with each other, but does not have a function of guiding electrode pads on the semiconductor chips 2a and 2b to pads having an enlarged pitch for connection to the external. Therefore, there is no need to form through holes penetrating the semiconductor substrate 3 and form conductive members buried in the through holes unlike a conventional example shown in FIG. 16, and thus correspondingly processing costs and time can be reduced. As a result, the total costs of the semiconductor device 1 can be decreased.

In addition, there is no need to form on the semiconductor substrate 3 pads that have large size and pitch in conformity to the design rule of the wiring board 7 for connection to the wiring board 7. That is, it is sufficient for the semiconductor substrate 3 to have thereon, as pads, only the pads 5, which are used for connection to the semiconductor chips 2a and 2b and thus have small size and pitch. Therefore, the semiconductor substrate 3 is allowed to have a small plane size. This small plane size leads to cost reduction of the semiconductor substrate 3.

Figure 17:
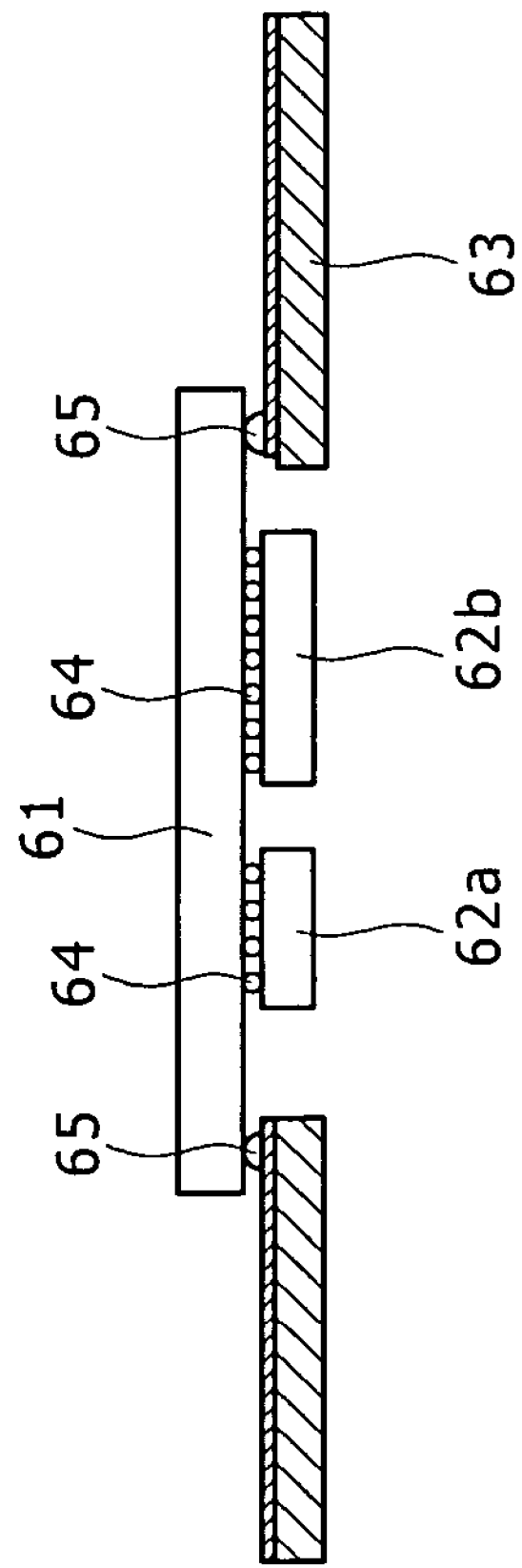
FIG. 17 is a sectional view illustrating a semiconductor device as a second conventional example.

Furthermore, the semiconductor chips 2a and 2b are connected to the wiring board 7 via the external-connection pads 13 provided directly on the semiconductor chips 2a and 2b, without the intermediary of interconnections on the semiconductor substrate 3. Therefore, compared with the conventional example in FIG. 17, in which the semiconductor chips 62a and 62b are connected to the wiring board 63 via the semiconductor substrate 61, the length of interconnections between the semiconductor chips and the wiring board can be decreased, which allows the suppression of delay of signal transmission between the semiconductor chips and the wiring board.

Moreover, as to interconnections, the semiconductor substrate 3 of the present embodiment has thereon only the chip-to-chip interconnections 4 but does not have interconnections for connecting the semiconductor chips 2a and 2b to the wiring board 7 as described above. Therefore, the chip-to-chip interconnections 4 can be formed collectively on a certain region on the semiconductor substrate 3 without the route design thereof suffering interference from the interconnections for connecting the semiconductor chips 2a aid 2b to the wiring board 7. Accordingly, the length of the chip-to-chip interconnections 4 can be decreased, which allows the suppression of delay of signal transmission between the semiconductor chips 2a and 2b.

Second Embodiment

Figure 9:
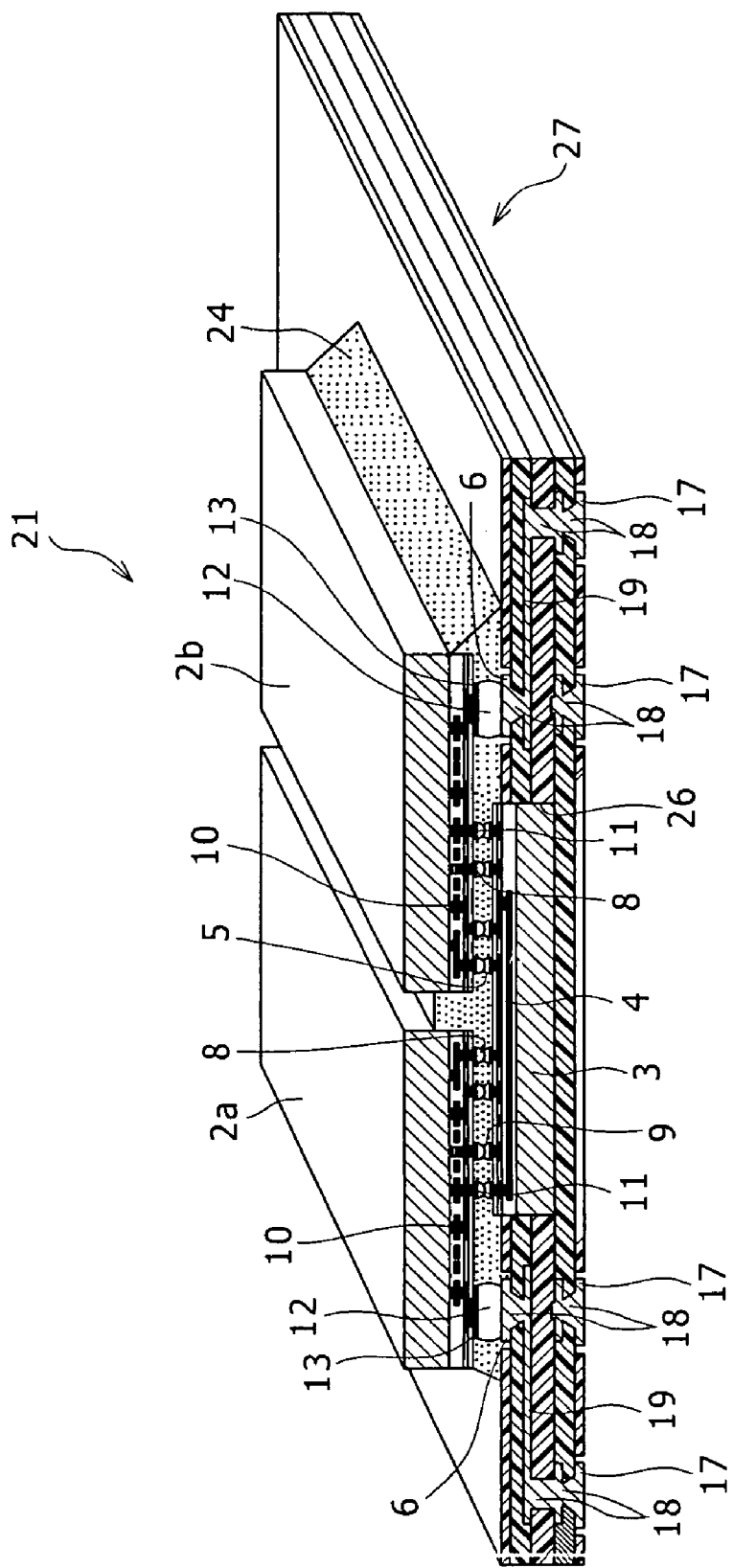
FIG. 9 is a partially sectional perspective view of a semiconductor device according to a second embodiment of the present invention.
Figure 10:
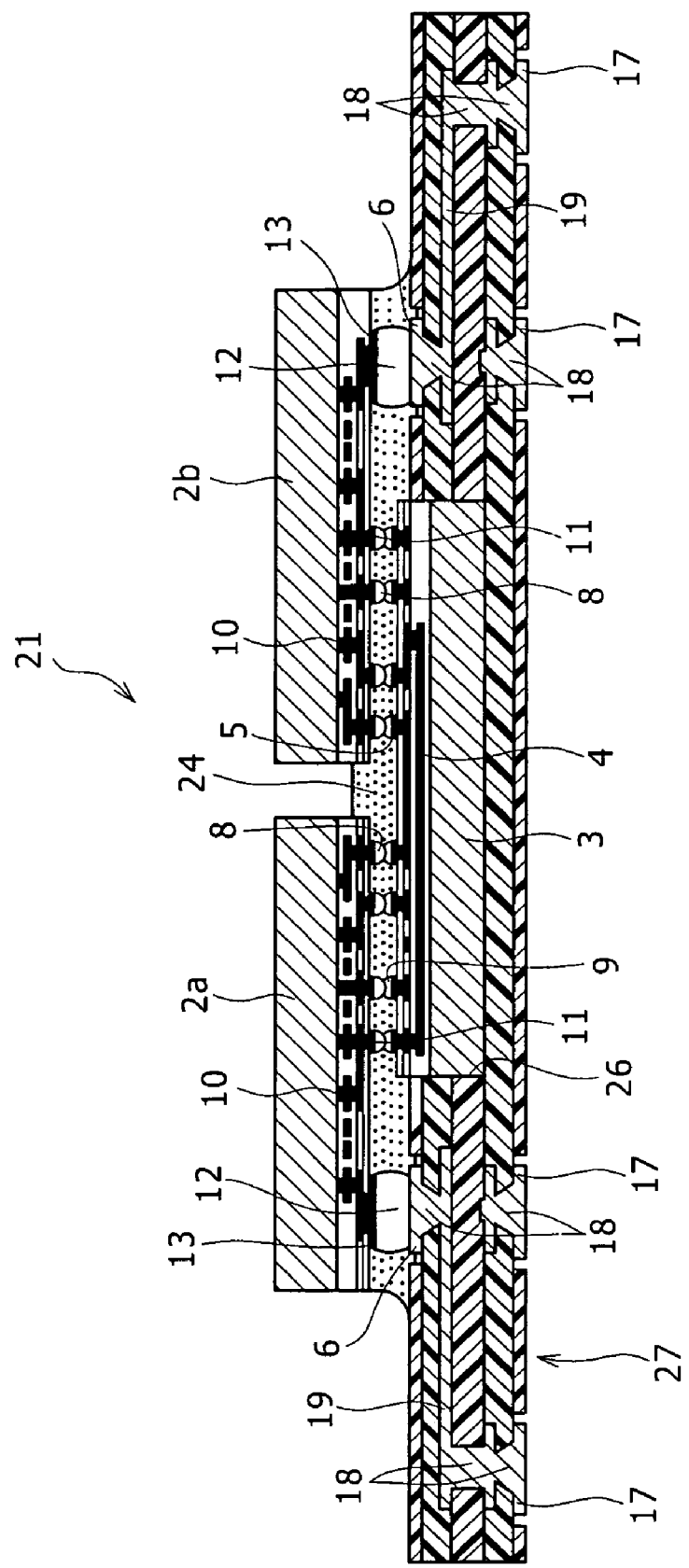
FIG. 10 is a sectional view of the semiconductor device according to the second embodiment.

FIG. 9 is a partially sectional perspective view illustrating a semiconductor device 21 according to a second embodiment of the present invention. FIG. 10 is a sectional view illustrating the semiconductor device 21. The same parts as those in the first embodiment are given the same numerals, and detailed description thereof will be omitted.

The semiconductor device 21 of the present embodiment includes a semiconductor substrate 3, a plurality of semiconductor chips 2a and 2b mounted on the semiconductor substrate 3, and a wiring board 27 connected to the semiconductor chips 2a and 2b.

The semiconductor substrate 3 has, on the same surface thereof, chip-to-chip interconnections 4 for electrically connecting the semiconductor chips 2a and 2b to each other, and a plurality of chip-connection pads 5 connected to the chip-to-chip interconnections 4.

The major surfaces (IC-formed surfaces) of the semiconductor chips 2a and 2b are connected via first connectors 8 and 9 to the chip-connection pads 5 on the semiconductor substrate 3. Thus, the semiconductor chips 2a and 2b are electrically connected to each other via the chip-to-chip interconnections 4 formed on the semiconductor substrate 3.

A plurality of external-connection pads 13 are formed on the major surfaces of the semiconductor chips 2a and 2b other than the region facing the semiconductor substrate 3. A plurality of lands 6 are formed on the wiring board 27. The pitches of the external-connection pads 13 and the lands 6 are larger than the pitch of the chip-connection pads 5 on the semiconductor substrate 3 (the pitch of the first connectors 8 and 9). The external-connection pads 13 are connected to the lands 6 via second connectors 12, and thus the semiconductor chips 2a and 2b are electrically connected to the wiring board 27.

The gap between the semiconductor chips 2a and 2b and the semiconductor substrate 3 and the gap between the semiconductor chips 2a and 2b and the wiring board 27 are filled with an underfill resin material 24, which protects the bonding parts between the semiconductor chips 2a and 2b and the semiconductor substrate 3, and those between the semiconductor chips 2a and 2b and the wiring board 27.

The semiconductor substrate 3 is placed in a hollow 26 formed in the wiring board 27 in such a manner that the chip-connection pads 5 and the first connectors 9 formed on the chip-connection pads 5 are exposed above the hollow 26. The hollow 26 is formed as a recess having the bottom. A resin material is provided between the inner wall faces of the hollow 26 and the bottom and side faces of the semiconductor substrate 3, and fixes the semiconductor substrate 3 in the hollow 26. The provision of the resin material in the hollow 26 may be carried out by providing the underfill resin material 24 therein collectively with the provision of the material 24 in the gaps between the semiconductor chips 2a and 2b and the semiconductor substrate 3, and between the semiconductor chips 2a and 2b and the wiring board 27. Alternatively, before the provision of the underfill resin material 24, another resin material for the hollow 26 may be supplied therein separately.

As described above, the present embodiment has a structure in which the semiconductor substrate 3 is buried in the wiring board 27 so as to be monolithic with the wiring board 27. Therefore, compared with the first embodiment, in which the semiconductor chips 2a and 2b and the semiconductor substrate 3 are supported by the wiring board 7 only through the bonding parts by the second connectors 12, stress acting on the bonding parts by the second connectors 12 (in particular, stress arising from the contraction of the organic wiring board, which has a large linear expansion coefficient, when the wiring board is subjected to a temperature cycle) can be reduced, which can enhance the bonding reliability of the bonding parts. In addition, since the semiconductor substrate 3 is supported in the hollow 26 of the wiring board 27, the bonding parts between the semiconductor chips 2a and 2b and the semiconductor substrate 3 by the small-size first connectors 8 and 9 can also be prevented from suffering excessive stress, which can enhance the bonding reliability of the bonding parts. As a result, the reliability of the bonding among the semiconductor chips 2a and 2b, the semiconductor substrate 3 and the wiring board 27 can be enhanced compared with the first embodiment.

Other advantages of the second embodiment are the same as those of the first embodiment.

An example of a manufacturing method of the semiconductor device 21 according to the second embodiment will be described with reference to FIGS. 11 and 12.

Figure 11:
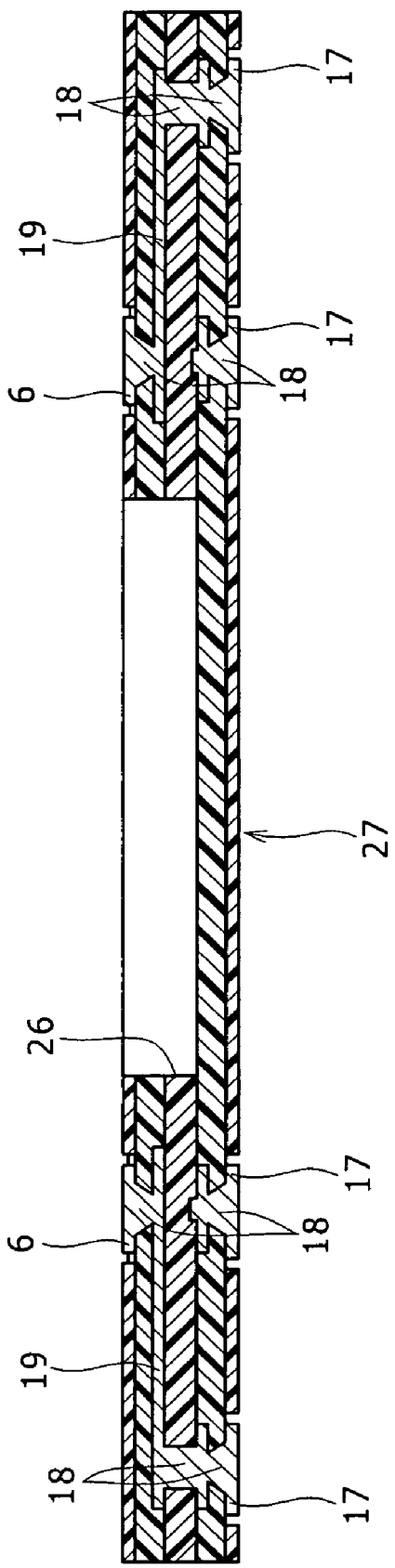
FIG. 11 is a first sectional view of a manufacturing step for the semiconductor device according to the second embodiment.

As shown in FIG. 11, formed in the center part of the wiring board 27 is the hollow 26 with a plane size slightly larger than that of the semiconductor substrate 3, as a recess having the bottom. This hollow 26 can be formed by a machine tool, a laser, etching, or another measure.

Figure 12:
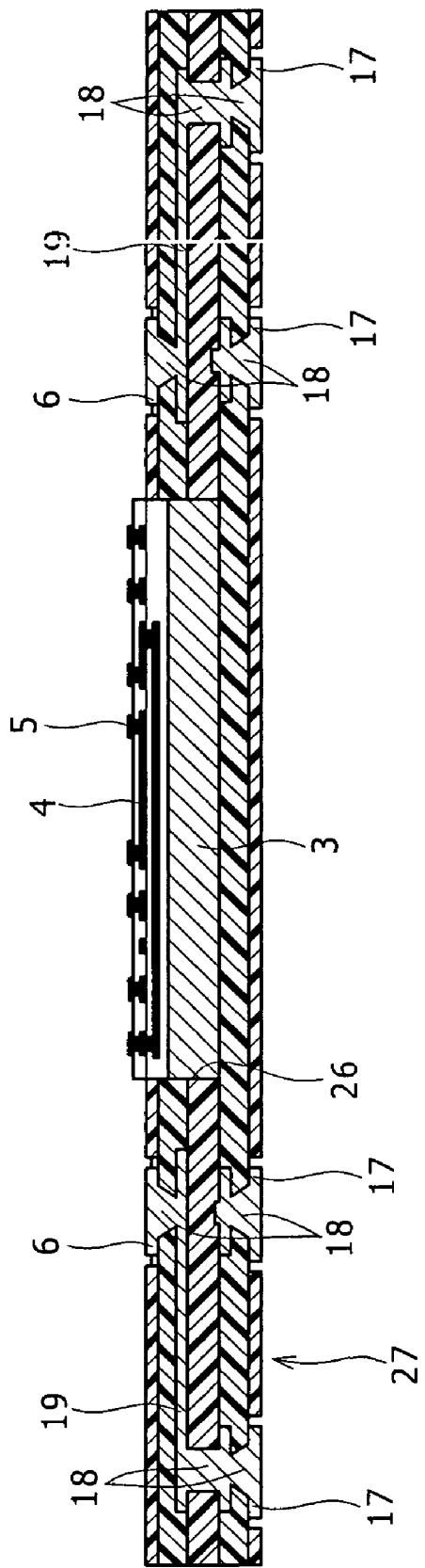
FIG. 12 is a second sectional view of a manufacturing step for the semiconductor device according to the second embodiment.

After a liquid or paste resin material is supplied on the bottom and sidewall faces of the hollow 26, the semiconductor substrate 3 is placed in the hollow 26 as shown in FIG. 12, and then the resin material is thermally cured for example, to thereby fix the semiconductor substrate 3 to the wiring board 27. Alternatively, after the semiconductor substrate 3 is placed in the hollow 26, the resin material may be supplied in the gap between the semiconductor substrate 3 and the hollow 26, and then may be cured.

In this state, the semiconductor chips 2a and 2b are bonded to the chip-connection pads 5 on the semiconductor substrate 3 via the first connectors 8 and 9, with the chip-connection pads 5 being located slightly above the surface of the wiring board 27 on which the lands 6 have been formed. Simultaneously with this bonding, the external-connection pads 13 on the semiconductor chips 2a and 2b are bonded to the lands 6 on the wiring board 27 via the second connectors 12. Adequate setting of the heights of the first and second connectors 8, 9 and 12 allows the chip-connection pads 5 on the semiconductor substrate 3 to be flush with the land-formed surface of the wiring board 27 or be located slightly below the land-formed surface, i.e., be located in the hollow 26.

If the semiconductor substrate 3 is thus buried in the wiring board 27 and fixed thereto in advance before the bonding between the semiconductor chips 2a and 2b and the semiconductor substrate 3, the semiconductor chips 2a and 2b can be picked up one by one to be mounted on the semiconductor substrate 3 by use of an existing mounting apparatus such as a vacuum suction tool.

In contrast, if the semiconductor chips 2a and 2b are bonded to the semiconductor substrate 3 in advance, and then the resultant component is bonded to the wiring board 27, there are the following problems. Specifically, when the plurality of semiconductor chips 2a and 2b are vacuum-suctioned in the bonding of the resultant component to the wiring board 27, failed suction due to an air leakage from the gap between the chips is possibly caused. In addition, in order to prevent the suctioned components from being inclined to the bonding surface in the hollow 26, the thicknesses of the plurality of semiconductor chips 2a and 2b must be equalized.

On the other hand, if the semiconductor substrate 3 is buried in the wiring board 27 in advance as described above, the semiconductor chips 2a and 2b can be picked up one by one with use of an existing vacuum suction tool, and can be mounted on the semiconductor substrate 3 in an existing way.

Third Embodiment

Figure 13:
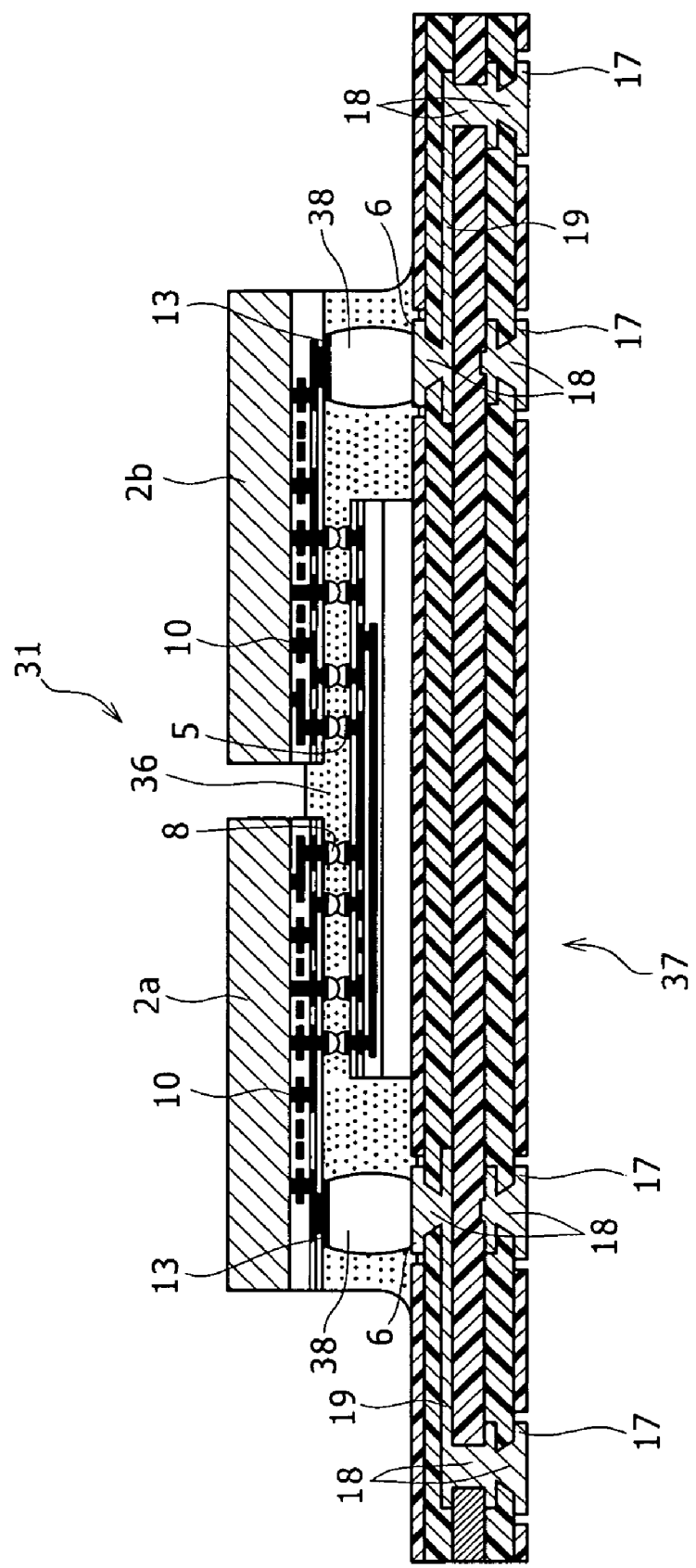
FIG. 13 is a sectional view of a semiconductor device according to a third embodiment of the present invention.

FIG. 13 illustrates a semiconductor device 31 according to a third embodiment of the present invention. The same parts as those in the first and second embodiments are given the same numerals, and detailed description thereof will be omitted.

The semiconductor device 31 of the present embodiment includes a semiconductor substrate 3, a plurality of semiconductor chips 2a and 2b mounted on the semiconductor substrate 3, and a wiring board 37 connected to the semiconductor chips 2a and 2b.

The semiconductor substrate 3 has, on the same surface thereof, chip-to-chip interconnections 4 for electrically connecting the semiconductor chips 2a and 2b to each other, and a plurality of chip-connection pads 5 connected to the chip-to-chip interconnections 4.

The major surfaces (IC-formed surfaces) of the semiconductor chips 2a and 2b are connected via first connectors 8 and 9 to the chip-connection pads 5 on the semiconductor substrate 3. Thus, the semiconductor chips 2a and 2b are electrically connected to each other via the chip-to-chip interconnections 4 formed on the semiconductor substrate 3.

A plurality of external-connection pads 13 are formed on the major surfaces of the semiconductor chips 2a and 2b other than the region facing the semiconductor substrate 3. A plurality of lands 6 are formed on the wiring board 37. The pitches of the external-connection pads 13 and the lands 6 are larger than the pitch of the chip-connection pads 5 on the semiconductor substrate 3 (the pitch of the first connectors 8 and 9). The external-connection pads 13 are connected to the lands 6 via second connectors 38, and thus the semiconductor chips 2a and 2b are electrically connected to the wiring board 37.

The gap between the semiconductor chips 2a and 2b and the semiconductor substrate 3 and the gap between the semiconductor chips 2a and 2b and the wiring board 37 are filled with an underfill resin material 36, which protects the bonding parts between the semiconductor chips 2a and 2b and the semiconductor substrate 3, and those between the semiconductor chips 2a and 2b and the wiring board 37.

In the present embodiment, the semiconductor substrate 3 is not placed in the wiring board 37, but is mounted on the surface of the wiring board 37 on which the lands 6 have been formed. Therefore, there is no need to form a hollow in the wiring board unlike the first and second embodiments, which can reduce processing costs and time correspondingly. However, the third embodiment is disadvantageous for reducing the thickness of the entire semiconductor device compared with the first and second embodiments, in which the semiconductor substrate 3 is located in the wiring boards 7 and 27, respectively.

In addition, the distance between the external-connection pads 13 on the semiconductor chips 2a and 2b and the lands 6 on the wiring board 37 is large, which inevitably requires the second connectors 38 connecting them to have a correspondingly large size. These large second connectors 38 force the external-connection pads 13 and the lands 6 to have large size and pitch. Conversely, the first and second embodiments allow the second connectors 12, the external-connection pads 13 and the lands 6 to have smaller size and pitch than those of the third embodiment, and therefore allow the achievement of a small plane size.

Figure 14:
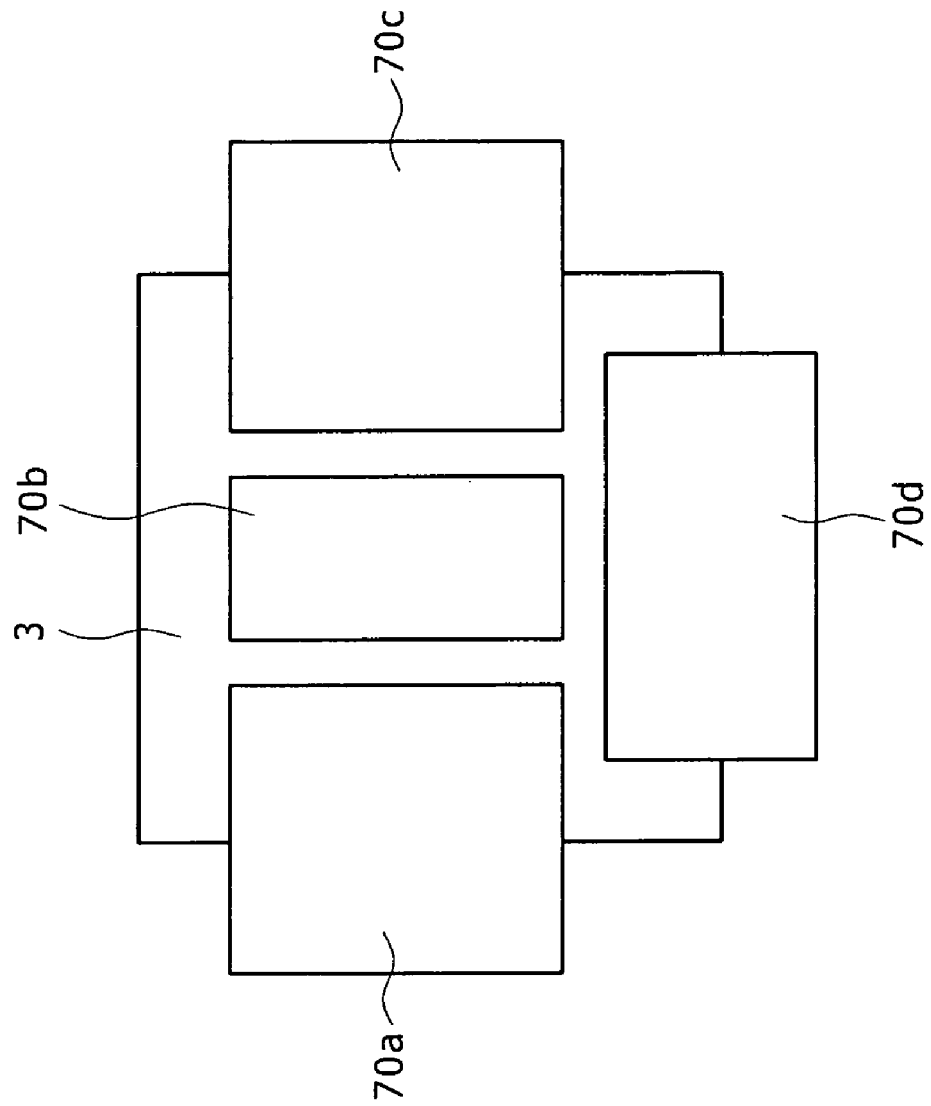
FIG. 14 is a plan view illustrating a modification in which a plurality of semiconductor chips are mounted on a semiconductor substrate.

The number of semiconductor chips mounted on the semiconductor substrate 3 is not limited to two, but may be three or more. FIG. 14 illustrates an example in which four semiconductor chips 70a to 70d are mounted on the semiconductor substrate 3. Of the plurality of semiconductor chips 70a to 70d, for example, one semiconductor chip serves as a memory element, while another semiconductor chip serves as a logic element. These plural semiconductor chips 70a to 70d may include the semiconductor chip 70b that is not directly coupled to an external wiring board, as long as at least one semiconductor chip of the plural chips is coupled to the external wiring board.

While a preferred embodiment of the present invention has been described using specific terms, such description is for illustrative purpose only, and it is to be understood that changes and variations may be made without departing from the spirit or scope of the following claims.

What is claimed is:

1. A semiconductor device comprising:
a plurality of semiconductor chips adjacent to one another;
a semiconductor substrate that has, on the same surface thereof, a chip-to-chip interconnection for electrically connecting the plurality of adjacent semiconductor chips to each other, and a plurality of chip-connection pads connected to the chip-to-chip interconnection; and
a wiring board that has a plurality of lands of which pitch is larger than a pitch of the chip-connection pads, wherein
a major surface of each of the plurality of semiconductor chips is connected to the chip-connection pads via a first connector so that the plurality of semiconductor chips are mounted on the semiconductor substrate, and
an external-connection pad is formed on the major surface other than a region facing the semiconductor substrate, and is connected to the land on the wiring board via a second connector.

2. The semiconductor device according to claim 1, wherein the semiconductor substrate is located in a hollow formed in the wiring board.

3. The semiconductor device according to claim 2, wherein a resin material is provided in the hollow in a manner of surrounding the semiconductor substrate, and the semiconductor substrate is bonded to the wiring board via the resin material.

4. A semiconductor device comprising:
a plurality of semiconductor chips adjacent to one another; and
a semiconductor substrate that has, on the same surface thereof, a chip-to-chip interconnection for electrically connecting the plurality of adjacent semiconductor chips to each other, and a plurality of chip-connection pads connected to the chip-to-chip interconnection, wherein
a major surface of each of the plurality of semiconductor chips is connected to the chip-connection pads via a connector so that the plurality of semiconductor chips are mounted on the semiconductor substrate, and
a plurality of external-connection pads are formed on the major surface other than a region facing the semiconductor substrate, the external-connection pads having a pitch larger than a pitch of the chip-connection pads.

* * * * *

UNITED STATES PATENT AND TRADEMARK OFFICE
CERTIFICATE OF CORRECTION

PATENT NO.      : 7,402,901 B2
APPLICATION NO. : 11/366123
DATED           : July 22, 2008
INVENTOR(S)     : Masaki Hatano and Yuji Takaoka It is certified that error appears in the above-identified patent and that said Letters Patent is hereby corrected as shown below:

ON THE TITLE PAGE

Item "(30) Foreign Application Priority Data

Mar. 16, 1920 (JP)    P2000-075165"

should be

Item --(30) Foreign Application Priority Data

Mar. 16, 2005 (JP)    P2000-075165--

Signed and Sealed this

Thirty-first Day of March, 2009

JOHN DOLL
*Acting Director of the United States Patent and Trademark Office*